(12) United States Patent
Cai et al.

(10) Patent No.: US 11,257,936 B2
(45) Date of Patent: Feb. 22, 2022

(54) METHOD FOR MAKING JFET DEVICE, JFET DEVICE AND LAYOUT STRUCTURE THEREOF

(71) Applicant: Shanghai Huahong Grace Semiconductor Manufacturing Corporation, Shanghai (CN)

(72) Inventors: Ying Cai, Shanghai (CN); Feng Jin, Shanghai (CN)

(73) Assignee: Shanghai Huahong Grace Semiconductor Manufacturing Corporation, Shanghai (CN)

(*) Notice: Subject to any disclaimer, the term of this patent is extended or adjusted under 35 U.S.C. 154(b) by 0 days.

(21) Appl. No.: 16/993,157

(22) Filed: Aug. 13, 2020

(65) Prior Publication Data
US 2021/0175349 A1  Jun. 10, 2021

(30) Foreign Application Priority Data
Dec. 10, 2019  (CN) .......................... 201911255993.6

(51) Int. Cl.
| | |
|---|---|
| *H01L 29/66* | (2006.01) |
| *H01L 29/06* | (2006.01) |
| *H01L 29/808* | (2006.01) |
| *H01L 21/225* | (2006.01) |
| *H01L 21/266* | (2006.01) |

(52) U.S. Cl.
CPC .... *H01L 29/66901* (2013.01); *H01L 29/0688* (2013.01); *H01L 29/808* (2013.01); *H01L 21/2253* (2013.01); *H01L 21/266* (2013.01); *H01L 29/0692* (2013.01)

(58) Field of Classification Search
CPC .......... H01L 29/66901; H01L 29/0688; H01L 29/808; H01L 21/2253; H01L 21/266; H01L 29/0692; H01L 29/1066; H01L 29/402; H01L 29/0615; H01L 29/36
See application file for complete search history.

(56) References Cited

FOREIGN PATENT DOCUMENTS

CN          105609568 A  *  5/2016

\* cited by examiner

*Primary Examiner* — Syed I Gheyas
(74) *Attorney, Agent, or Firm* — Murtha Cullina LLP

(57) ABSTRACT

According to some embodiments in this application, a method for making a JFET device is disclosed in the following steps: forming a substrate; performing ion implantation on the first region and the second region of the substrate to form a deep N-type well, wherein the deep N-type well is formed with at least two sub-wells region; forming a field oxide in the second region; forming a P-type well in one side of the sub-well in the deep N-type well; performing P-type ion implantation on the third region and the fourth region to respectively form a first P-type heavily doped region and a second P-type heavily doped region; and performing N-type ion implantation on the fifth region, the sixth region, and the seventh region to respectively form a first N-type heavily doped region, a second N-type heavily doped region, and a third N-type heavily doped region.

13 Claims, 4 Drawing Sheets

METHOD FOR MAKING JFET DEVICE, JFET DEVICE AND LAYOUT STRUCTURE THEREOF

CROSS-REFERENCE TO RELATED APPLICATIONS

This application claims priority to Chinese patent application No. CN 201911255993.6 filed on Dec. 10, 2019, and entitled "METHOD FOR MAKING JFET DEVICE, JFET DEVICE AND LAYOUT STRUCTURE THEREOF", the disclosure of which is incorporated herein by reference in entirety.

TECHNICAL FIELD

The application relates to the technical field of semiconductor manufacturing, and in particular to a method for making a JFET device, a JFET device, and a layout structure thereof.

BACKGROUND

A junction field-effect transistor (JFET) is a three-electrode device with amplifying function composed of a gate, source and drain of a PN junction, and working principle thereof is to control output current by changing the conductivity of the channel by means of voltage.

In the related art, for ultra-high voltage JFET devices, in order to improve the breakdown voltage (BV) under the OFF state, PTOP (P-type ion implantation) are usually introduced in a drift region to help depletion of deep N-type well (DNW), resulting in a shorter drift region size and improved JFET current density.

However, the PTOP would cause, during the ON state of JFET, parasitic effect between PTOP, DNW and PW (P-well) when the drain is subjected to a high voltage. Since PW is the gate of the JFET device, parasitic leakage causes the ON state breakdown voltage (ON-BV) of the JFET device becomes lower, thereby reducing the reliability of the device.

SUMMARY

According to some embodiments in this application, a method for making a JFET device is disclosed in the following steps:
forming a substrate;
performing ion implantation on the first region and the second region of the substrate to form a deep N-type well, wherein the deep N-type well is formed with at least two sub-wells in the second region, and doping concentration of the sub-wells is in a lateral concentration gradient;
forming a field oxide in the second region;
forming a P-type well in one side of the sub-well in the deep N-type well;
performing P-type ion implantation on the third region and the fourth region to respectively form a first P-type heavily doped region and a second P-type heavily doped region, wherein the first P-type heavily doped region is located outside the deep N-type well, and the second P-type heavily doped region is located in the P-type well; and
performing N-type ion implantation on the fifth region, the sixth region, and the seventh region to respectively form a first N-type heavily doped region, a second N-type heavily doped region, and a third N-type heavily doped region, wherein the first N-type heavily doped region is located in the deep N-type well and between the first P-type heavily doped region and the second P-type heavily doped region, the second N-type heavily doped region is located in the P-type well and between the field oxide and the second P-type heavily doped region, and the third N-type heavily doped region is located in the deep N-type well and located at the other side of the sub-well; and
the first N-type heavily doped region is the source of the JFET device, the second P-type heavily doped region and the P-type well are the first electrode of gate of the JFET device, the first P-type heavily doped region and the substrate are the second electrode of gate of the JFET device, and the third N-type heavily doped region is the drain of the JFET device.

In example embodiments, performing ion implantation on the first region and the second region of the substrate to form the deep N-type well includes:
applying photoresist to regions other than the first region and the second region, and applying photoresist to at least one sub-region of the second region;
performing ion implantation on the first region and the second region to form a first sub-doped region located in the first region and at least two second sub-doped regions located in the second region;
removing the photoresist; and
performing heat-treatment on the first sub-doped region and the second sub-doped region by a high-temperature drive-in process to form the deep N-type well.

In example embodiments, applying the photoresist to at least one sub-region of the second region includes:
applying the photoresist to a plurality of sub-regions of the second region, wherein the distance between sub-regions ranges from 2 μm to 10 μm.

In example embodiments, the width of the sub-well ranges from 2 microns to 10 microns.

In example embodiments, the temperature of the heat treatment is greater than 1000 degrees Celsius.

In example embodiments, the time of the heat treatment is greater than 100 minutes.

In example embodiments, after performing N-type ion implantation on the fifth region, the sixth region, and the seventh region to respectively form a first N-type heavily doped region, a second N-type heavily doped region, and a third N-type heavily doped region also includes:
respectively forming a first electrode of gate field plate and a second electrode of gate field plate on the field oxide, wherein the first electrode of gate field plate is connected to the second N-type heavily doped region;
depositing a dielectric layer on the substrate and the field oxide;
respectively forming contact structures in the dielectric layers on the first P-type heavily doped region, the first N-type heavily doped region, the second P-type heavily doped region, the second N-type heavily doped region, the first electrode of gate field plate, the second electrode of gate field plate, and the third N-type heavily doped region; and
forming a metal line on each of the contact structures.

In example embodiments, electrical connection is achieved, through the same metal line, for the contact structures on the second P-type heavily doped region and the second N-type heavily doped region; and electrical connection is achieved, through the same metal line, for the contact structures on the second electrode of gate field plate and the third N-type heavily doped region.

According to some embodiments in this application, a JFET device is disclosed, including:

a substrate, wherein a deep N-type well is formed in the substrate, the deep N-type well is formed with at least two sub-wells in a second region, and the doping concentration of the sub-wells is in a lateral gradient;

a field oxide formed on the sub-well;

a P-type well formed in the deep N-type well and located in one side of the sub-well;

a first P-type heavily doped region located outside the deep N-type well;

a second P-type heavily doped region located in the P-type well;

a first N-type heavily doped region located in the deep N-type well and located between the first P-type heavily doped region and the second P-type heavily doped region;

a second N-type heavily doped region located in the P-type well and between the field oxide and the second P-type heavily doped region; and a third N-type heavily doped region located in the deep N-type well and at the other side of the sub-well;

wherein the first N-type heavily doped region is the source of the JFET device, the second P-type heavily doped region and the P-type well are the first electrode of gate of the JFET device, the first P-type heavily doped region and the substrate are the second electrode of gate of the JFET device, and the third N-type heavily doped region is the drain of the JFET device.

In example embodiments, the distance between the sub-wells ranges from 2 microns to 10 microns.

In example embodiments, the width of the sub-well ranges from 2 microns to 10 microns.

In example embodiments, a first electrode of gate field plate and a second electrode of gate field plate are also formed on the field oxide, and the first electrode of gate field plate is connected to the second N-type heavily doped region;

a dielectric layer is also formed on the substrate and the field oxide;

contact structures are formed on the first P-type heavily doped region, the first N-type heavily doped region, the second P-type heavily doped region, the second N-type heavily doped region, the first electrode of gate field plate, the second electrode of gate field plate and the third N-type heavily doped region; and metal lines are formed on each of the contact structures.

In example embodiments, electrical connection is achieved, through the same metal line, for the contact structures on the second P-type heavily doped region and the second N-type heavily doped region; and electrical connection is achieved, through the same metal line, for the contact structures on the second electrode of gate field plate and the third N-type heavily doped region.

According to some embodiments in this application, a layout structure of a JFET device is disclosed, including:

a drain;

a first electrode of gate field plate circumferentially arranged in the outer side of the drain;

a deep N-type well including at least two sub-wells, wherein the at least two sub-wells are sequentially circumferentially arranged in the outer side of the first electrode of gate field plate, and the drain and the first electrode of gate field plate are arranged in the deep N-type well;

a second electrode of gate field plate circumferentially arranged in the deep N-type well and having an overlapping region with the outermost sub-well and P-type well, wherein:

the P-type well is circumferentially arranged in the outer side of the second electrode of gate field plate and having an overlapping area with the second electrode of gate field plate; and a source arranged in the deep N-type well and located outside the P-type well.

In example embodiments, the sub-well has a circular ring shape, an oval ring shape, or a bullet ring shape.

The technical solution of the application includes at least the following advantages.

By forming a deep N-type well including at least two sub-wells during the fabrication process of the JFET device, since the doping concentration of the sub-well are in a lateral gradient, the deep N-type well including at least two sub-wells in a lateral gradient concentration is easier to be depleted than a deep N-type well with flat concentration distribution, so that a higher JFET current density can be achieved without arrangement of PTOP, so as to improve the on-state breakdown voltage of the device, thereby further improving the reliability of the device in a certain extent.

BRIEF DESCRIPTION OF THE DRAWINGS

In order to more clearly explain the embodiments of the application or the technical solutions in the related art, the drawings required for the detailed description or the description of the related art are briefly described below. Obviously, the drawings in the following description are some embodiments of the application. For those of ordinary skill in the art, other drawings may be obtained based on these drawings without any creative labor.

DETAILED DESCRIPTION

Figure 1:
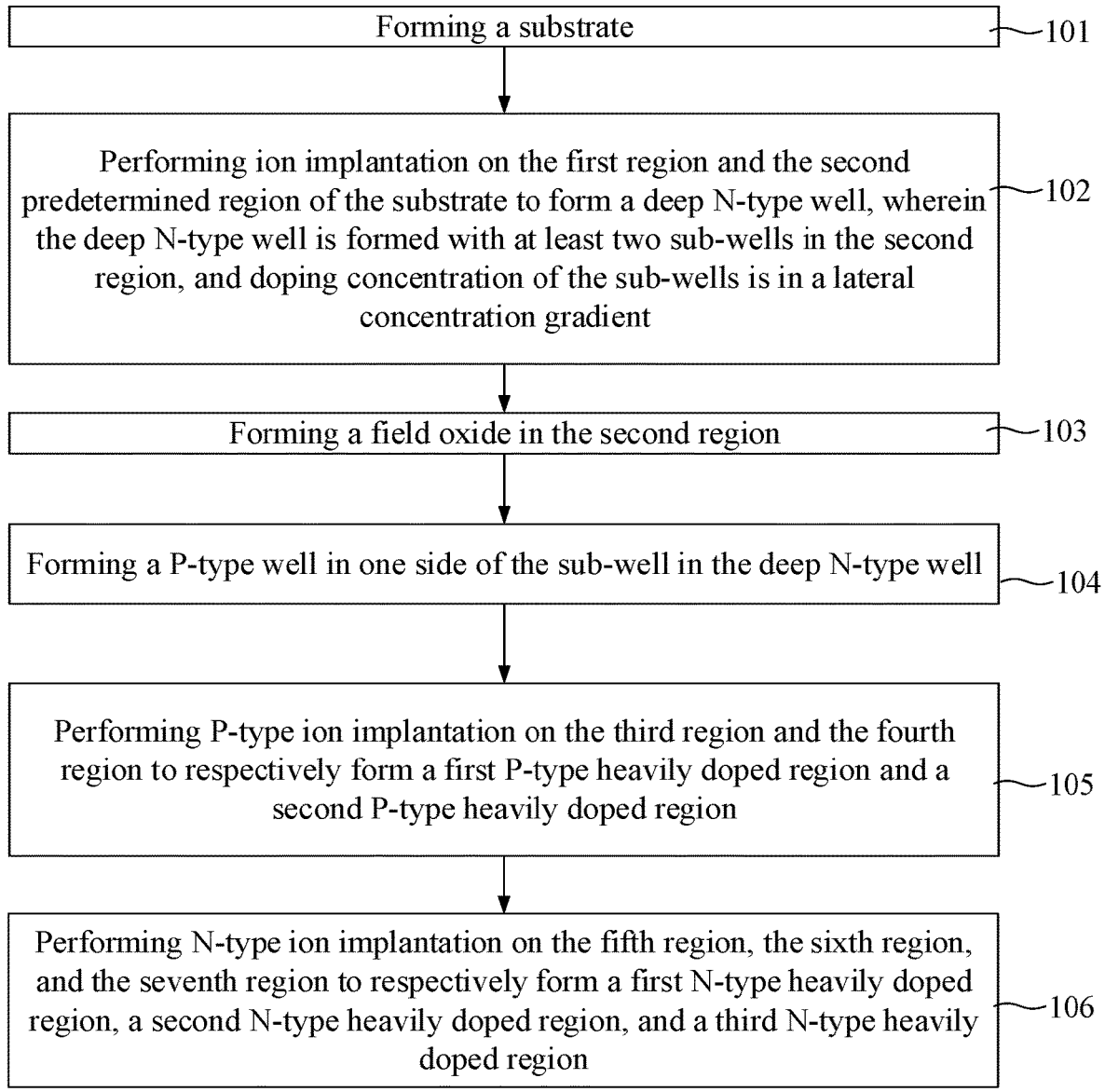
FIG. 1 is a flowchart of a method for making a JFET device according to example embodiments of the application.

The technical solutions in the application will be described clearly and completely below with reference to the drawings. Obviously, the described embodiments are some, but not all, of the embodiments of the application. On the basis of the embodiments in the application, all other embodiments obtained by those of ordinary skill in the art without creative efforts fall within protection scope of the application.

In the description of the application, it should be noted that the orientation or positional relationship indicated by the terms "center", "upper", "lower", "left", "right", "vertical", "horizontal", "inner", "outer", etc. is based on the orientation or positional relationship shown in the drawings, only for the convenience of description of the application and simplifying the description, rather than indicating or implying that the referred device or element must have a specific orientation or be configured or operated with a specific orientation, and thus cannot be understood as a limitation of the application. In addition, the terms "first", "second", and "third" are for descriptive purposes only, and cannot be understood as indicating or implying relative importance.

In the description of the application, it should be noted that, unless otherwise clearly specified and defined, terms "install", "connect", and "attach" should be understood broadly, for example, they can be fixed or detachable connection, or integral connection; mechanical connection or electrical connection; and direct connection, or indirect connection through an intermediary, or internal communication between two components, and wireless connection or wired connection. For those of ordinary skill in the art, the specific meaning of the above terms in the application can be understood in specific situations.

In addition, the technical features related to different embodiments of the application described below can be combined as long as they do not conflict with each other.

Referring to FIG. 1, which shows a method for making a JFET device according to example embodiments of the application, the method includes the following content.

Step 101, forming a substrate.

Step 102, performing ion implantation on the first region and the second region of the substrate to form a deep N-type well, wherein the deep N-type well is formed with at least two sub-wells in the second region, and doping concentration of the sub-wells is in a lateral concentration gradient.

Figure 2:
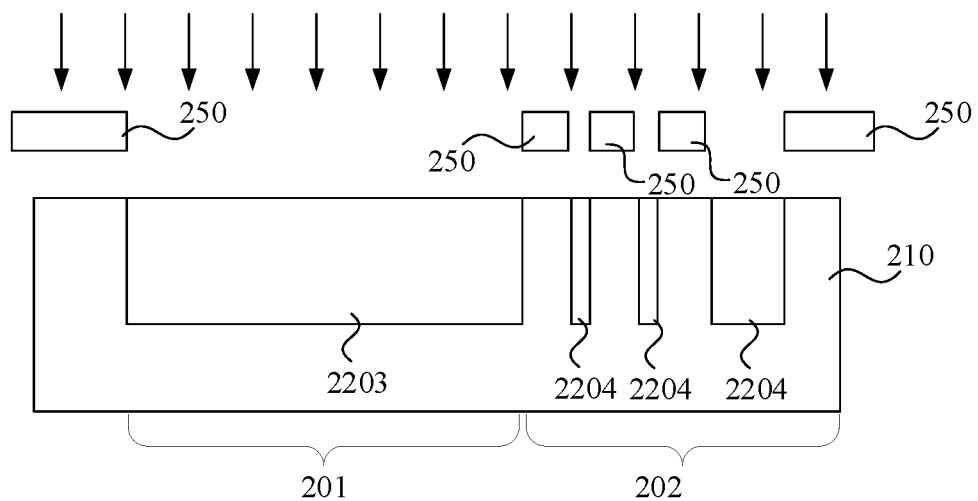
FIG. 2 is a section view of ion implantation on a first region and a second region of the substrate according to example embodiments of the application.
Figure 3:
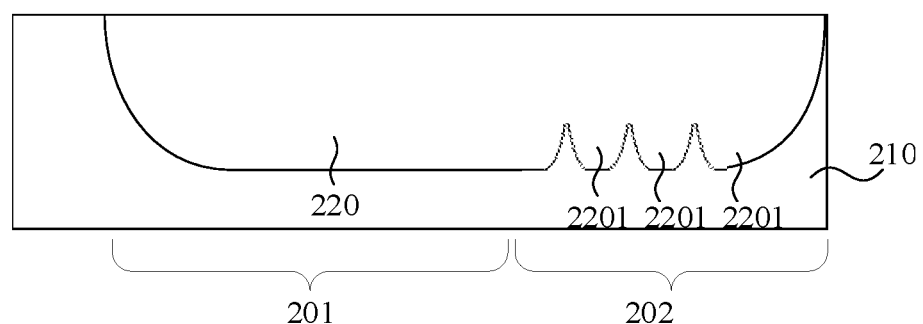
FIG. 3 is a section view of a deep N-type well formed after ion implantation on the first region and the second region of the substrate according to example embodiments of the application.

FIG. 2 is a section view of ion implantation on a first region and a second region of the substrate; and FIG. 3 is a section view of a deep N-type well formed after ion implantation on the first region and the second region of the substrate.

As shown in FIGS. 2 and 3, after ion implantation is performed on the first region 201 and the second region 202 of the substrate 210 (the substrate 210 is a P-type substrate), a deep N-type well 220 is formed. The N-type well 220 includes at least two sub-wells 2201 formed in the second region 202, and doping concentration of each sub-well 2201 has a lateral gradient.

Step 103, forming a field oxide in the second region.

Step 104, forming a P-type well in one side of the sub-well in the deep N-type well.

Figure 4:
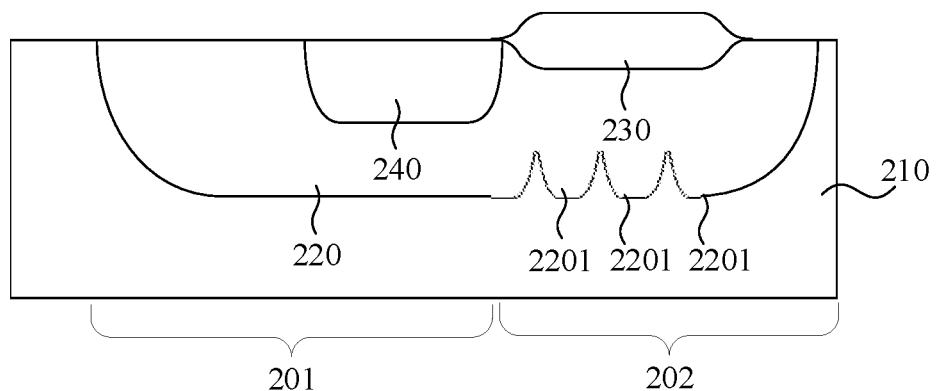
FIG. 4 is a section view for forming the field oxide and the P-type well at the second region according to example embodiments of the application

FIG. 4 is a section view for forming the field oxide 230 and the P-type well 240 at the second region 202. Referring to FIG. 4, the field oxide 230 may be formed on the second region 202 by Local Oxidation of Silicon (LOCOS) process, and the field oxide 230 includes silicon dioxide or silicon oxide. For example, a silicon nitride layer may be deposited after a silicon dioxide layer is grown on the second region 202, the middle region of the silicon nitride layer is etched until the silicon layer is exposed, the silicon dioxide layer is grown in the middle region, and the remaining silicon nitride layer is removed to form the field oxide 230; and a P-type well 240 is formed in a region at the side of the sub-well 2201 in the deep N-type well 220 by means of P-type ion implantation.

Step 105, performing P-type ion implantation on the third region and the fourth region to respectively form a first P-type heavily doped region and a second P-type heavily doped region.

Here, the third region is located outside the deep N-type well 220, and the fourth region is located in the P-type well 240.

Step 106, performing N-type ion implantation on the fifth region, the sixth region, and the seventh region to respectively form a first N-type heavily doped region, a second N-type heavily doped region, and a third N-type heavily doped region.

Here, the fifth region is located in the deep N-type well 220 and between the first P-type heavily doped region 251 and the second P-type heavily-doped region 252, the sixth region is located in the P-type well 240 and is located between the field oxide 230 and the second P-type heavily doped region 252, and the seventh region is located in the deep N-type well 220 and at the other side of the sub-well 2201.

Figure 5:
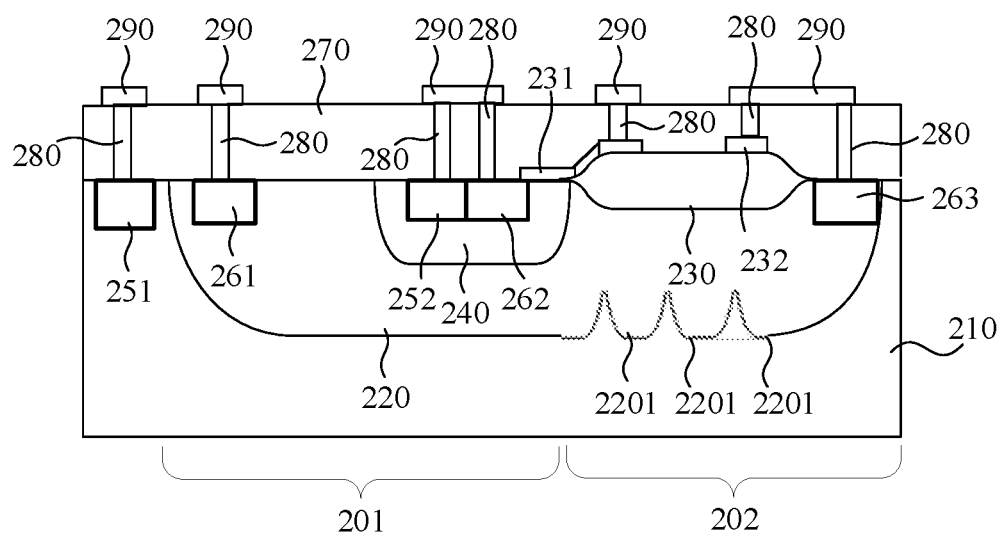
FIG. 5 is a section view of a JFET device according to example embodiments of the application.

FIG. 5 shows a section view of the JFET device formed after steps 105 and 106.

Referring to FIG. 5, P-type ion implantation is performed on the third region to form the first P-type heavily doped region 251 outside the deep N-type well 220; and P-type ion implantation is performed on the fourth region to form the second P-type heavily doped region 252 in the P-type well 240.

Referring to FIG. 5, N-type ion implantation is performed on the fifth region to form a first N-type heavily doped region 261 located in the deep N-type well 220 and between the first P-type heavily doped region 251 and the second P-type heavily doped region 252; N-type ion implantation is performed on the sixth region to form a second N-type heavily doped region 262 located in the P-type well 240 and between the field oxide 230 and the second P-type heavily doped region 252; and N-type ion implantation is performed on the seventh region to form a third N-type heavily doped region 263 located in the deep N-type well 220 and at the other side of the sub-well 2201.

Here, the first N-type heavily doped region 261 is the source of the JFET device, the second P-type heavily doped region 252 and the P-type well 240 are the first electrode of gate of the JFET device, the first P-type heavily doped region 251 and the substrate 210 are the second electrode of gate of the JFET device, and the third N-type heavily doped region 263 is the drain of the JFET device.

In summary, in this application, by forming a deep N-type well including at least two sub-wells during the fabrication process of the JFET device, since the doping concentration of the sub-wells is in a lateral, the deep N-type well including at least two sub-wells in a lateral gradient concentration is easier to be depleted than a deep N-type well with flat concentration distribution, so that a higher JFET current density can be achieved without arrangement of PTOP, so as to improve the on-state breakdown voltage of the device, thereby further improving the reliability of the device in a certain extent.

In example embodiments, "performing ion implantation on the first region and the second region of the substrate to form a deep N-type well" in step 102 includes but not limited to: applying photoresist 250 to regions other than the first region 201 and the second region 202, and applying the photoresist 250 on at least one sub-region of the second region 202; performing ion implantation on the first region 201 and the second region 202 to form a first sub-doped region 2203 located in the first region 201 and at least two second sub-doped regions 2204 located in the second region 202; removing the photoresist 250; and performing heat-treatment on the first sub-doped region 2203 and the second sub-doped region 2204 by a high-temperature drive-in process to form the deep N-type well 220. In example embodiments, the temperature of the high-temperature drive-in process is higher than 1000 degrees Celsius, and the time is longer than 100 minutes.

Referring to FIG. 2, photoresist 250 is applied on the substrate 210 by photolithography, and the photoresist 250 is applied to regions other than the first region 201 and the second region 202 and at least one sub-region of the second region 202 (exemplarily illustrated in FIG. 2 by applying the photoresist 250 to three sub-regions of the second region 202), and the first sub-doped region 2203 and three second sub-doped regions 2204 are formed by performing ion implantation on the first region 201 and the second region 202; and referring to FIG. 3, heat-treatment is performed on the first sub-doped region 2203 and the three second sub-doped regions 2204 by a high-temperature drive-in process to form the deep N-type well 220.

In example embodiments, "applying the photoresist to at least one sub-region of the second region 202" includes but not limited to: applying the photoresist to a plurality of sub-regions of the second region 202, wherein the distance between the sub-regions ranges from 2 µm to 10 µm; In example embodiments, the width of the formed sub-well 2201 ranges from 2 µm to 10 µm; in the embodiment, the heat treatment temperature is greater than 1000 degrees Celsius; and In example embodiments, the heat treatment time is greater than 100 minutes.

In example embodiments, after step 106, the following are also included.

Step 106a, respectively forming a first electrode of gate field plate and a second electrode of gate field plate on the field oxide.

As an example, referring to FIG. 5, after step 107, a first electrode of gate field plate 231 and a second electrode of gate field plate 232 are formed on the field oxide 230, and the first electrode of gate field plate 231 and the second N-type heavily doped region 262 are connected.

Step 106b, depositing a dielectric layer on the substrate and the field oxide.

As an example, referring to FIG. 5, after step 108, a dielectric layer 270 is formed.

In step 106c, respectively forming contact structures in the dielectric layers on the first P-type heavily doped region, the first N-type heavily doped region, the second P-type heavily doped region, the second N-type heavily doped region, the first electrode of gate field plate, the second electrode of gate field plate, and the third N-type heavily doped region.

Step 106d, forming a metal line on each of the contact structures.

As an example, referring to FIG. 5, after step 109 and step 110, contact structures 280 are formed in the dielectric layers on the first P-type heavily doped region 251, the first N-type heavily doped region 261, the second P-type heavily doped region 252, the second N-type the heavily doped region 262, the first electrode of gate field plate 231, the second electrode of gate field plate 232, and the third N-type heavily doped region 263, and a metal line 290 is formed at each contact structure 280.

In example embodiments, electrical connection is achieved, through the same metal line 290, for the contact structures 280 on the second P-type heavily doped region 252 and the second N-type heavily doped region 262; and electrical connection is achieved, through the same metal line 290, for the contact structures 280 on the second electrode of gate field plate 232 and the third N-type heavily doped region 263.

Referring to FIG. 5, a JFET device provided by the application can be made by any of the above method embodiments, and the JFET device includes:

a substrate 210, wherein the substrate 210 is a P-type substrate, a deep N-type well 220 is formed in the substrate 210, the deep N-type well 220 is formed with at least two sub-wells 2201 in the second region 202, and doping concentration of the sub-wells 2201 are in lateral gradient;

a field oxide 230 formed on the sub-well 2201;

a P-type well 240 formed in the deep N-type well 220 and located in one side of the sub-well 2201;

a first P-type heavily doped region 251 located outside the deep N-type well 220;

a second P-type heavily doped region 252 located in the P-type well 240;

a first N-type heavily doped region 261 located in the deep N-type well 220 and between the first P-type heavily doped region 251 and the second P-type heavily doped region 252;

a second N-type heavily doped region 262 located in the P-type well 240 and between the field oxide 230 and the second P-type heavily doped region 252; and a third N-type heavily doped region 263 located in the deep N-type well 220 and at the other side of the sub-well 2201.

Here, the first N-type heavily doped region 261 is the source of the JFET device, the second P-type heavily doped region 252 and the P-type well 240 are the first electrode of gate of the JFET device, the first P-type heavily doped region 251 and the substrate 210 are the second electrode of gate of the JFET device, and the third N-type heavily doped region 263 are the drain of the JFET device.

In example embodiments, the distance between sub-wells 2201 ranges from 2 microns to 10 microns; and in example embodiments, the width of the sub-well 2201 ranges from 2 microns to 10 microns.

In example embodiments, a first electrode of gate field plate 231 and a second electrode of gate field plate 232 are also formed on the field oxide 230, and the first electrode of gate field plate 231 is connected to the second N-type heavily doped region 262; a dielectric layer 270 is also formed on the substrate 210 and the field oxide 230; In example embodiments, contact structures 280 are formed on the first P-type heavily doped region 251, the first N-type heavily doped region 261, the second P-type heavily region 252, the second N-type heavily doped region 262, the first electrode of gate field plate 231, the second electrode of gate field plate 232, and the third N-type heavily doped region 263; and in example embodiments, a metal line 290 is formed on each contact structure 280.

In example embodiments, electrical connection is achieved, through the same metal line 290, for the contact structures 280 on the second P-type heavily doped region 252 and the second N-type heavily doped region 262; and electrical connection is achieved, through the same metal line 290, for contact structures 280 on the second electrode of gate field plate 232 and the third N-type heavily doped region 263.

Figure 6:
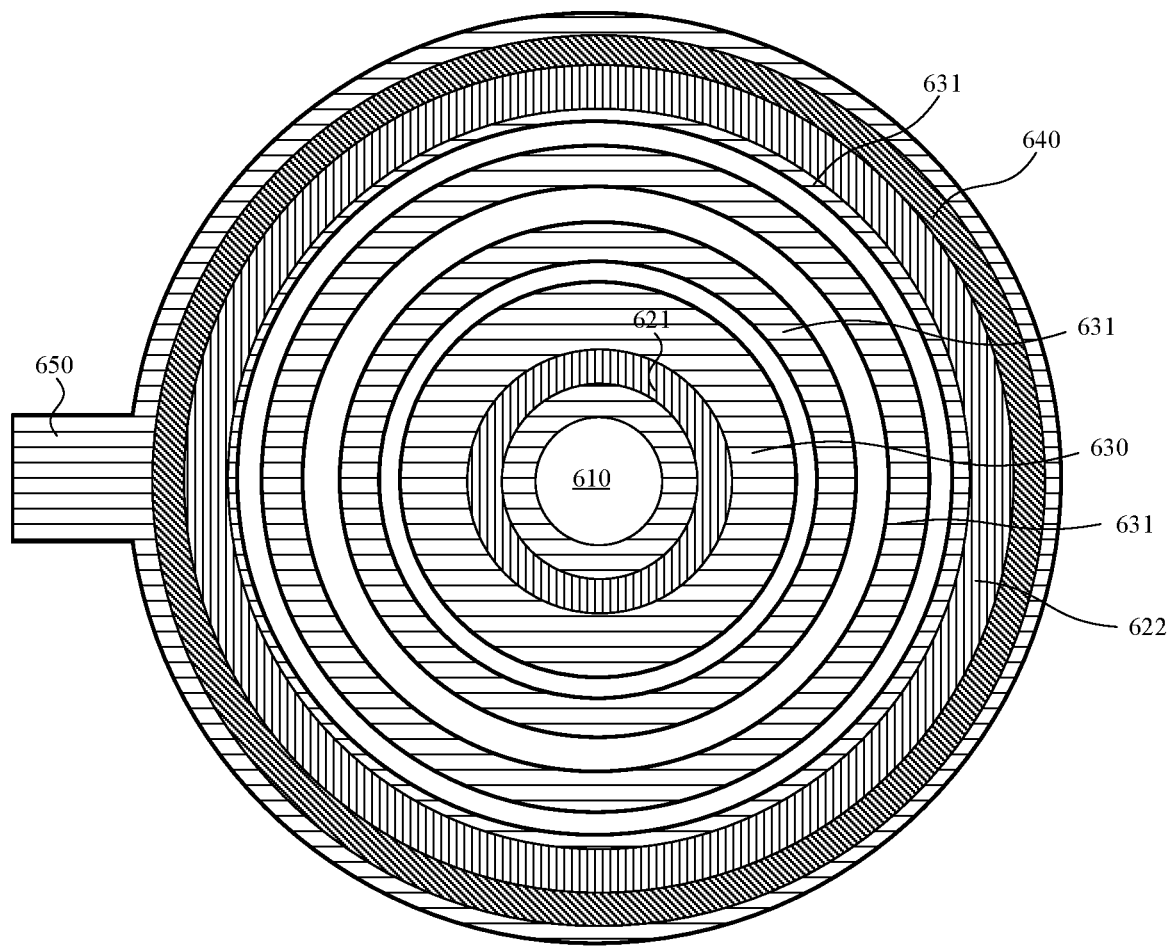
FIG. 6 is a plan view of a layout structure of a JFET device according to example embodiments of the application.

Referring to FIG. 6, it shows a plan view of a JFET layout structure according to example embodiments of the application. The layout structure can be used in any of the foregoing method embodiments. The layout structure includes:

a drain 610;

a first electrode of gate field plate 621 circumferentially arranged on the outer side of the drain 610;

a deep N-type well 630 including at least two sub-wells 631, wherein the at least two sub-wells 631 are sequentially circumferentially arranged in the outer side of the first electrode of gate field plate 621, and the drain 610 and the first electrode of gate field plate 621 are arranged in the deep N-type well 630;

a second electrode of gate field plate 622 circumferentially arranged in the deep N-type well 630 and having an overlapping region with the outermost sub-well 631 and the P-well 640;

a P-type well 640 circumferentially arranged in the outer side of the second electrode of gate field plate 622 and having an overlapping region with the second electrode of gate field plate 622; and a source 650 arranged in the deep N-type well 630 and located outside the P-type well 640.

It should be noted that the first electrode of gate field plate 621 in the embodiment of FIG. 6 corresponds to the second electrode of gate field plate 232 in the above embodiment, and the second electrode of gate field plate 622 in the embodiment of FIG. 6 corresponds to the first electrode of gate field plate 231 in the above embodiment.

In example embodiments, the sub-well 631 has a circular ring shape, an oval ring shape, or a bullet ring shape.

Obviously, the above examples are only instances for clear explanation, and are not limitations to the implementation. For those of ordinary skill in the art, other different forms of changes or modifications can be made based on the above description. There is no need to and can not exhaustively list all implementations. Obvious changes or modifications derived herein are still within the protection scope set forth in the application.

What is claimed is:

1. A method for making a JFET device, comprising:
   forming a substrate;
   performing ion implantation on the first region and the second region of the substrate to form a deep N-type well, wherein the deep N-type well is formed with at least two sub-wells in the second region, and doping concentration of the sub-wells is in a lateral concentration gradient;
   forming a field oxide in the second region;
   forming a P-type well in one side of the sub-well in the deep N-type well;
   performing P-type ion implantation on the third region and the fourth region to respectively form a first P-type heavily doped region and a second P-type heavily doped region, wherein the first P-type heavily doped region is located outside the deep N-type well, and the second P-type heavily doped region is located in the P-type well; and
   performing N-type ion implantation on the fifth region, the sixth region, and the seventh region to respectively form a first N-type heavily doped region, a second N-type heavily doped region, and a third N-type heavily doped region, wherein the first N-type heavily doped region is located in the deep N-type well and between the first P-type heavily doped region and the second P-type heavily doped region, the second N-type heavily doped region is located in the P-type well and between the field oxide and the second P-type heavily doped region, and the third N-type heavily doped region is located in the deep N-type well and located at the other side of the sub-well; and
   the first N-type heavily doped region is the source of the JFET device, the second P-type heavily doped region and the P-type well are the first electrode of gate of the JFET device, the first P-type heavily doped region and the substrate are the second electrode of gate of the JFET device, and the third N-type heavily doped region is the drain of the JFET device.

2. The method according to claim 1, wherein performing ion implantation on the first region and the second region of the substrate to form the deep N-type well comprises:
   applying photoresist to regions other than the first region and the second region, and applying photoresist to at least one sub-region of the second region;
   performing ion implantation on the first region and the second region to form a first sub-doped region located in the first region and at least two second sub-doped regions located in the second region;
   removing the photoresist; and
   performing heat-treatment on the first sub-doped region and the second sub-doped region by a high-temperature drive-in process to form the deep N-type well.

3. The method according to claim 2, wherein applying the photoresist to at least one sub-region of the second region comprises:
   applying the photoresist to a plurality of sub-regions of the second region, wherein the distance between sub-regions ranges from 2 μm to 10 μm.

4. The method according to claim 3, wherein the width of the sub-well ranges from 2 microns to 10 microns.

5. The method according to claim 4, wherein the temperature of the heat treatment is greater than 1000 degrees Celsius.

6. The method according to claim 5, wherein the time of the heat treatment is greater than 100 minutes.

7. The method according to claim 1, wherein after performing N-type ion implantation on the fifth region, the sixth region, and the seventh region to respectively form a first N-type heavily doped region, a second N-type heavily doped region, and a third N-type heavily doped region, the method further comprises:
   respectively forming a first electrode of gate field plate and a second electrode of gate field plate on the field oxide, wherein the first electrode of gate field plate is connected to the second N-type heavily doped region;
   depositing a dielectric layer on the substrate and the field oxide;
   respectively forming contact structures in the dielectric layers on the first P-type heavily doped region, the first N-type heavily doped region, the second P-type heavily doped region, the second N-type heavily doped region, the first electrode of gate field plate, the second electrode of gate field plate, and the third N-type heavily doped region; and
   forming a metal line at each of the contact structures.

8. The method according to claim 7, wherein electrical connection is achieved, through the same metal line, for the contact structures on the second P-type heavily doped region and the second N-type heavily doped region; and
   electrical connection is achieved, through the same metal line, for the contact structures on the second electrode of gate field plate and the third N-type heavily doped region.

9. A JFET device, comprising:
   a substrate, wherein a deep N-type well is formed in the substrate, the deep N-type well is formed with at least two sub-wells in a second region, and doping concentration of the sub-wells is in a lateral gradient;
   a field oxide formed on the sub-well;
   a P-type well formed in the deep N-type well and located in one side of the sub-well;
   a first P-type heavily doped region located outside the deep N-type well;

a second P-type heavily doped region located in the P-type well;

a first N-type heavily doped region located in the deep N-type well and located between the first P-type heavily doped region and the second P-type heavily doped region;

a second N-type heavily doped region located in the P-type well and between the field oxide and the second P-type heavily doped region; and a third N-type heavily doped region located in the deep N-type well and at the other side of the sub-well;

wherein the first N-type heavily doped region is the source of the JFET device, the second P-type heavily doped region and the P-type well are the first electrode of gate of the JFET device, the first P-type heavily doped region and the substrate are the second electrode of gate of the JFET device, and the third N-type heavily doped region is the drain of the JFET device.

10. The JFET device according to claim 9, wherein the distance between the sub-wells ranges from 2 microns to 10 microns.

11. The JFET device according to claim 10, wherein the width of the sub-well ranges from 2 microns to 10 microns.

12. The JFET device according to claim 9, wherein a first electrode of gate field plate and a second electrode of gate field plate are also formed on the field oxide, and the first electrode of gate field plate is connected to the second N-type heavily doped region;

a dielectric layer is also formed on the substrate and the field oxide;

contact structures are formed on the first P-type heavily doped region, the first N-type heavily doped region, the second P-type heavily doped region, the second N-type heavily doped region, the first electrode of gate field plate, the second electrode of gate field plate and the third N-type heavily doped region; and metal lines are formed on each of the contact structures.

13. The JFET device according to claim 12, wherein electrical connection is achieved, through the same metal line, for the contact structures on the second P-type heavily doped region and the second N-type heavily doped region; and electrical connection is achieved, through the same metal line, for the contact structures on the second electrode of gate field plate and the third N-type heavily doped region.

* * * * *